Figure 1:
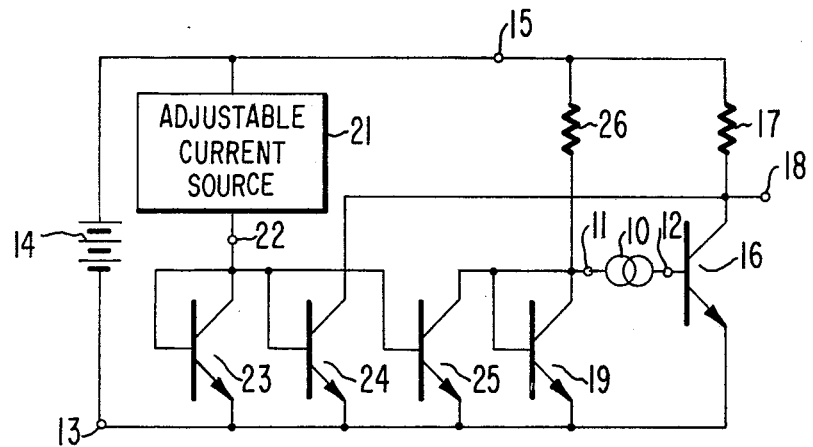

United States Patent [19]
Hall

[11] 3,942,129
[45] Mar. 2, 1976

[54] CONTROLLED GAIN AMPLIFIER
[75] Inventor: James Robert Hall, Canoga Park, Calif.
[73] Assignee: RCA Corporation, New York, N.Y.
[22] Filed: Nov. 4, 1974
[21] Appl. No.: 520,792

[52] U.S. Cl. .................... 330/29; 330/38 M; 330/40
[51] Int. Cl.² .......................................... H03G 3/30
[58] Field of Search.......... 330/22, 29, 19, 38 M, 40

[56] References Cited
UNITED STATES PATENTS
3,828,266  8/1974  Okada et al. .......................... 330/29

OTHER PUBLICATIONS
Widlar, "Design Techniques for Linear Integrated Circuits," Electronic Communicator, Nov./Dec. 1966, pp. 7, 8.

Primary Examiner—James B. Mullins
Attorney, Agent, or Firm—H. Christoffersen; S. Cohen; A. L. Limberg

[57] ABSTRACT

A common-emitter amplifier transistor has its gain controlled by change of its transconductance as a function of its quiescent emitter current. A first controlled current applied to a diode means develops a potential thereacross which is applied between the base and emitter electrodes of the amplifier transistor. This configuration causes the quiescent collector and emitter currents of the amplifier transistor to be in well-defined proportion to the first controlled current. This permits a second controlled current linearly related to the first to be used to counteract changes in the quiescent collector current of the common-base amplifier transistor, insofar as being coupled to the amplifier load.

8 Claims, 4 Drawing Figures

CONTROLLED GAIN AMPLIFIER

The present invention relates to amplifiers with electrically controlled gain.

It is desirable, particularly in monolithic integrated circuits, to have an amplifier which, though its gain is electrically controlled, exhibits no changes in the quiescent level of its output signal when it is controlled. This facilitates the direct coupling of the output circuit of the amplifier to succeeding circuitry. Such amplifiers are described, for instance, in U.S. Pat. Nos. 3,141,137; 3,678,403; 3,678,406; 3,737,796 and 3,803,505.

The present invention is embodied in a common-emitter transistor amplifier having its gain controlled by change of the transconductance or $g_m$ of the transistor as a function of its quiescent emitter current level. A first controlled current applied to a diode means develops a potential thereacross which is applied between the base and emitter electrodes of the amplifier transistor. This configuration causes the quiescent collector and emitter currents of the amplifier transistor to be in well-defined proportion to the first controlled current. This permits a second controlled current linearly related to the first to be used to counteract changes in the quiescent collector current of the common-base amplifier transistor, insofar as being coupled to the amplifier load.

Figure 2:
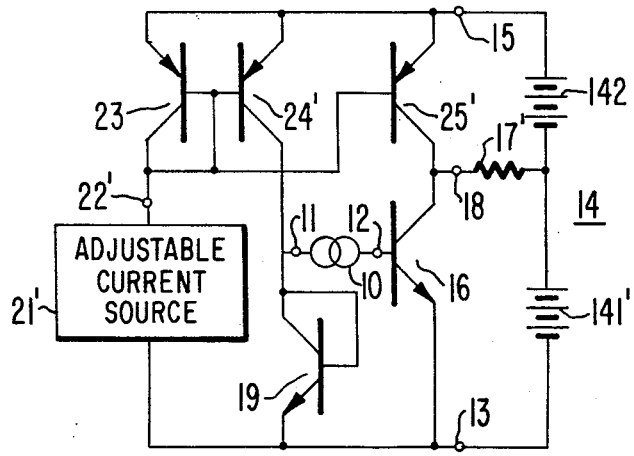
Figure 3:
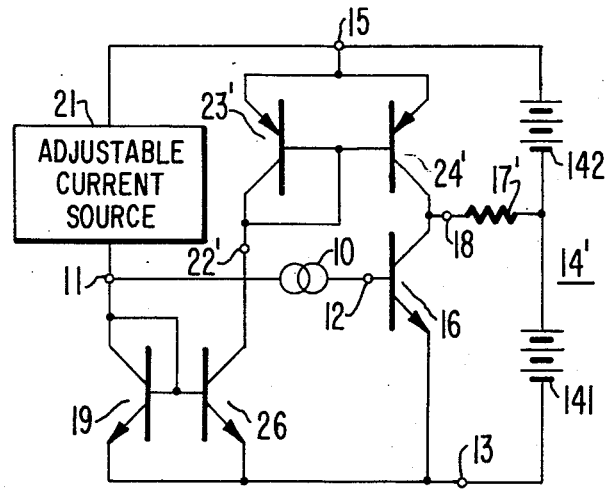
Figure 4:
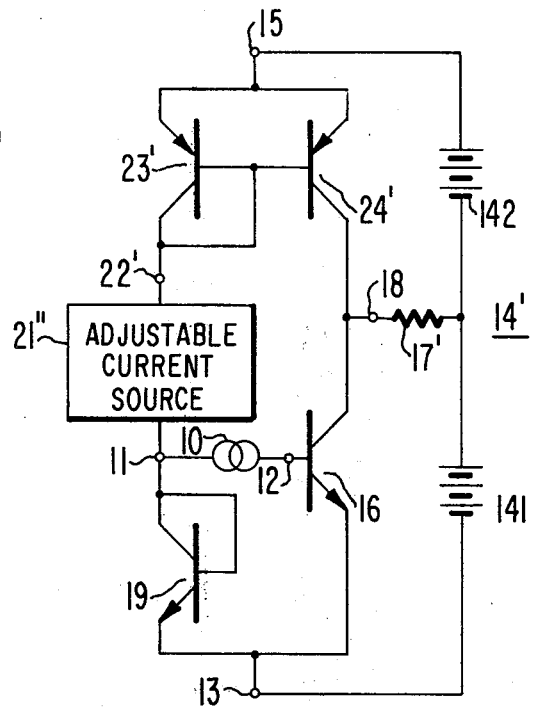

In the drawing:

FIG. 1 is a schematic diagram of a common-emitter amplifier with electrically controlled gain, embodying the present invention and not requiring complementary conductivity transistors; and FIGS. 2, 3 and 4 are schematic diagrams of other embodiments of the present invention, these using complementary conductivity transistors.

In the figures, a source 10 of input signal potential is connected between terminals 11 and 12. Terminal 13 is at a reference potential supplied by battery 14 (or 14'), which also supplies an operating potential to terminal 15. Transistor 16 is connected in common-emitter amplifier configuration to develop an output signal potential across resistor 17, which appears at an output terminal 18 for direct coupling to a subsequent circuit (not shown). The base and emitter electrodes of transistor 16 are connected to terminals 12 and 13, respectively. A quiescent potential developed across a self-biased transistor 19 appears at terminal 11 and is coupled through source 10 and terminal 12 to the base electrode of transistor 16. The self-biased transistor 19 has its base electrode connected to its collector electrode and functions as a diode means. An adjustable current source 21 (or 21' or 21'') supplies a selected value of current as control signal to a control terminal 22 (or 22'), from which it is direct coupled to control the forward biasing of the diode means 19.

In FIG. 1, when the control signal current from source 21 is zero-valued, no potential offset responsive to current is developed across self-biased transistor 23. Transistors 24 and 25 have this zero-valued offset potential applied to their base electrodes and are therefore biased for non-conduction. For this condition, the forward-bias current for diode means 19 is developed solely in response to the operating potential at terminal 15 causing current flow through the series connection of resistor 26 and self-biased transistor 19, in accordance with Ohm's Law.

Transistors 19 and 16 form the well-known current mirror amplifier configuration having a gain $G_I$ insofar as direct currents are concerned. The ratio of the transconductance of transistor 16 to that of transistor 19 at equal base-emitter potentials, $G_I$, is the same as the ratio of the effective area of the base-emitter junction of transistor 16 to that of the base-emitter junction of transistor 19, assuming them to be of the same semiconductive material and to have the same diffusion profiles as is the case in monolithic integrated circuit construction for instance. The quiescent collector current of transistor 16 is $G_I$ times as large as that of transistor 19, and the potential drop across load resistor 17 is easily calculated in accordance with Ohm's Law.

It is for this condition wherein the current from source 21 is zero-valued and transistor 25 is not biased into conduction, that the gain of the common-emitter amplifier configuration including transistor 16 is the greatest. As is well-known, the voltage gain, $G_V$, of a common-emitter amplifier having no emitter degeneration is equal to its transconductance $g_m$ times its collector load resistance. The load resistance in the present instance is $R_{17}$, the resistance of resistor 17. In equation form:

$$G_V = g_m R_{17} \tag{1}$$

The transconductance $g_m$ of a transistor is proportional to its emitter current, $I_E$, so equation 1 may be rewritten as follows where $V'$ is a constant expressed in units of potential and equal to about 26 millivolts.

$$G_V = \frac{I_E}{V'} R_{17} \tag{2}$$

With transistor 25 being non-conductive, it demands no portion of the current flow through resistor 26. So, the full current flow through resistor 26 is applied to self-biased transistor 19, causing the largest possible potential drop thereacross. This forward biases the base-emitter junction of transistor 16 to fullest extent, causing maximum emitter current flow and highest transconductance. As can be seen from equation 1 or 2, this is the condition corresponding to the highest value $G_{V\ MAX}$ of signal voltage gain, $G_V$.

Transistors 24 and 25 have their respective transconductances in $G_I$:1 ratio as well as do transistors 16 and 19. For the condition where the current applied from source 21 to terminal 22 has been increased to a positive value, transistors 24 and 25 will have their respective base-emitter junctions forward biased to develop like base-emitter potentials, and their respective collector currents will be in $G_I$:1 ratio. The collector current demand of transistor 25 will be supplied from the current flowing in resistor 26, thereby diverting a portion of the current flow through resistor 26 away from self-biased transistor 19. The resistor 26 with substantially constant potential theracross and transistor 25 co-operate to function as a first controlled current source, the control signal for the source being supplied from adjustable current source 21.

In consequence of the conduction through transistor 25, the offset potential across self-biased transistor 19 will become smaller and the collector and emitter current flow of transistor 16 will be reduced. Because of the current mirror amplifier action of transistors 19, 16, brought about by the proportioning of their transconductance characteristics, the reduction of the emitter and collector current flows of transistor 16 is in the same proportion as the reduction in current flow through the self-biased transistor 19. So, the flow of a collector current $I_{C25}$ of specified value in transistor 25, causing a like-valued reduction in the current flow through self-biased transistor 19, will by the current mirror amplifier action of transistors 19, 16 cause a reduction of the collector current demand of transistor 16 of a value $G_I I_{C25}$. Were transistor 24 to contribute no current flow through resistor 17, then, in accordance with Ohm's Law, this decrease of $G_I I_{C25}$ in the collector current demand of transistor 16, would lead to the potential at output terminal 18 by increasing by $G_I I_{C25} R_{17}$.

This is precluded, however, because transistor 24, having a transconductance $G_I$ times as large as transistor 25, demands a collector current $G_I$ times as large as the $I_{C25}$ collector current demanded by transistor 25. This demand by transistor 24 for a collector current of $G_I I_{C25}$ is exactly equal to the reduction in quiescent collector current demand by transistor 16, so the quiescent potential across resistor 17 is not altered. This, of course, facilitates the direct coupling of terminal 18 to subsequent circuitry. Transistor 24 functions as a second controlled current source, its control signal also being supplied from adjustable current source 21.

This condition, where positive current flows from source 21 to terminal 22 causes transistor 25 to demand collector current and to divert current flow from the self-biased transistor 19. The resultant reduction of the potential across self-biased transistor 19 causes a reduction of gain in the common-emitter amplifier configuration including transistor 16 and resistor 17. This is because of the reduction of the emitter current $I_E$ of transistor 16 for this condition, which reduces the transconductance $g_m$ of transistor 16. The effects of these changes upon the voltage gain $G_V$ of the common-emitter amplifier configuration can be adjudged from equations 1 and 2 above.

Self-biased transistor 23 in the FIG. 1 circuit is in current mirror amplifier configuration with transistors 24 and 25 and serves to define very exactly the relationship between control current from source 21 and the degree of attenuation obtained in the common-emitter amplifier configuration comprising transistor 16 and resistor 17. This is of importance chiefly in open-loop control systems where uniformity of response between many units and independence from the common-emitter forward current gains of transistors 24 and 25 are sought. In a closed-loop control system employing degenerative feedback, such as an automatic gain control system, self-biased transistor 23 will often be found unnecessary (or even undesirable inasmuch as it reduces feedback loop gain and thus accuracy of control) and consequently may be omitted in such cases.

Certain other modifications which can be made in the FIG. 1 circuit will occur to one skilled in electronic circuit design. For example, resistors 26 and 17 may be replaced by constant current sources providing currents in $1:G_I$ ratio. Transistors 16 and 19 may be provided with emitter degeneration resistors to improve the accuracy of the proportioning between their transconductances at higher emitter current levels. Transistors 24 and 25 and, if used, 23 may be provided with emitter degeneration resistors to improve the accuracy of the proportions between their respective transconductances. The collector electrode of transistor 25 may be connected to a tap point in resistor 26, rather than to its end. The circuit will work with other types of transistors than bipolar junction transistors (e.g., junction field-effect transistors or metal-oxide-semiconductor field-effect transistors). A whole class of modifications exists wherein the simple current mirror amplifier configurations of transistors 19, 16 and of transistors 23, 24 and 25 are replaced by nearly any one of the well-known more complex current mirror amplifier configurations.

The FIG. 1 circuit is advantageous in that it requires only one conductivity type of transistor. It does have the problem, however, that as the gain $V_G$ of the common emitter amplifier configuration 16, 17 is reduced, the gain of transistor 24 is increased. This may result in the level of noise internally generated in the transistors 16 and 24 remaining relatively constant despite signal at terminal 18 being much attenuated with a resultant undesirable reduction of signal-to-noise ratio at terminal 18. Providing transistors 23, 24 and 25 with emitter degeneration can help alleviate this condition. And, of course, by-passing terminal 22 to terminal 12 with a large capacitance will help to prevent noise from source 21 reducing the signal-to-noise ratio at terminal 18. This shortcoming with regard to reduced signal-to-noise ratio at low signal currents is also found in many prior art attenuators which are provided with compensation for changes in the quiescent output signal level. If one can permit the use of transistors of complementary conductivity types, as shown in FIGS. 2, 3 and 4, however, then it is possible to overcome this problem.

In the FIG. 2 configuration, resistors 17 and 26 are discarded and are replaced by the current sources provided at the collector electrodes of transistors 24' and 25', respectively, of complementary conductivity type to that of transistors 16 and 19. The currents provided at the collector electrodes of transistors 24' and 25' are in $G_I:1$ ratio, respectively. Battery 14' comprises two serially-connected batteries 141 and 142. This makes an intermediate potential available at terminal 143. Collector load resistor 17' connects terminal 143 to terminal 18, to which the collector electrodes of transistors 16 and 24' are also each connected. The circuit is so configured that the quiescent collector current demand of NPN transistor 16 is always supplied in substantially exact measure by the collector current of PNP transistor 24'. Therefore, substantially no quiescent current flows in resistor 17', and the quiescent potential at terminal 18 is substantially equal to the intermediate potential. The circuit is such that the relative potentials of batteries 141 and 142 can be selected to place the intermediate potential anywhere in the range of a few tenths volts more positive than reference potential at terminal 13 to a few tenths less positive than operating potential at terminal 15.

More particularly, when source 21 supplies no current to terminal 22', neither of transistors 24' or 25' is biased into conduction. No current is applied to self-biased transistor 19, so no potential is developed across it. In the absence of forward bias potential between its base and emitter electrodes transistor 16 has very low transconductance $g_m$ and provided no gain for input signal from source 10. With both transistors 16 and 24' non-conductive, there is no noise supplied from or through them to terminal 18.

When current source 21' does supply a relatively small current to bias transistors 24' and 25' to a relatively low level of conduction, the collector current of transistor 24' develops a potential drop across self-biased transistor 19 that also biases transistor 16 into a relatively low level of conduction. Even at these low collector current levels, the quiescent collector current levels of transistors 16 and 24' match. The transconductances of transistors 16 and 24' are low so they do not greatly amplify noise accompanying their base-emitter potentials, avoiding degradation of the signal-to-noise ratio at terminal 18 due to this cause. Further, at low current levels, the internally generated noise of transistors 16 and 24' themselves is low, which also helps maintain good signal to noise ratio at terminal 18 for the large signal attenuation condition.

When current source 21' supplies a relatively large current to bias transistors 24', 25' and 16, to relatively high levels of conduction, the gain $G_V$ of the common-emitter amplifier 16, 17' will be increased in similar proportion to the increase of current from source 21'. Self-biased transistor 23' may be included to define the ratio of control current from source 21' to the quiescent collector currents of transistors 16 and 24', if one so desires. But, because of the push-pull nature of the collector currents of transistors 16 and 24', there is less need for self-biased transistor 23' than there is for self-biased transistor 23 in the FIG. 1 circuit.

The FIG. 2 configuration is adapted for use with an adjustable current source 21' that withdraws a positive current from terminal 22'. It is, for example, well-suited for use with a circuit in which control current is supplied from the collector electrode of an NPN transistor. It may, however, be necessary or desirable to operate with an adjustable current source 21 supplying a positive control current to a control terminal 22 as from the collector electrode of a PNP transistor, for example.

FIG. 3 shows a circuit accomodating such need or desire. The adjustable current source 21 supplies a current flowing through terminal 10, 11 for direct application to the self-biased transistor 19. An increase of this current from source 21 will by current mirror amplifier action of transistors 19 and 16 increase the emitter current $I_E$ and hence the transconductance $g_m$ of transistor 16. There will result a concomitant proportional increase in the gain $G_V$ of the common-emitter amplifier configuration 16, 17. A decrease of this current from source 21 will by current mirror amplifier action of transistors 19 and 16 cause a decrease of the emitter current $I_e$ and hence the transconductance $g_m$ of transistor 16. There will result a concomitant proportional increase in the gain $G_V$ of the common base amplifier configuration 16, 17. When no current is supplied from source 21 a condition of no gain will obtain.

Self-biased transistor 19 is in current mirror amplifier configuration with transistor 26, so the collector current of transistor 26 varies in linear proportion to the current supplied to terminal 11 by source 21 and is used to supply current to terminal 22''. The product of the current gains of the current mirror amplifier configuration comprising transistors 19 and 26 and that comprising transistors 23' and 24' should equal $G_I$, the current gain of the current mirror amplifier configuration comprising transistors 19 and 16. Then, the quiescent potential at terminal 18 will remain unchanged despite change in the level of control current supplied from source 21.

FIG. 4 shows a variation of the FIG. 3 circuit in which an adjustable current source 21'' is connected between terminals 11 and 22'', permitting the elimination of transistor 26. Transistors 23' and 24' have their transconductance characteristics proportioned in the same ratio as those of transistors 19 and 16, respectively. The gain $G_V$ of the common-emitter amplifier configuration 16, 17 will vary in proportion to the level of current provided by the adjustable current source 21''. The current source 21'' may comprise, for example, a transistor having its emitter electrode connected by direct current conductive means to one of the terminals 11 and 22', having its collector electrode connected to the other of the terminals 11 and 22', and having a control signal applied to its base electrode.

Modifications discussed in connection with the FIG. 1 circuit may be made to the circuits of FIGS. 2, 3 and 4, where applicable. Also, in each of the circuits, all the transistors of each conductivity type may be replaced by transistors of the complementary conductivity type. The present invention may be implemented using field-effect transistors and the terms "base," "emitter" and "collector" in the claims are to be construed as being descriptive of the "gate," "source" and "drain" electrodes, respectively, of a field-effect transistor in addition to their conventional meaning.

What is claimed is:

1. An amplifier, the ratio of its output signal to its input signal being responsive to a control signal, said amplifier comprising:

first and second terminals having connected therebetween a source of said input signal with a direct current conductive path therethrough;

a third terminal for application of a reference potential;

a fourth terminal for supplying said output signal;

a load direct coupled to said fourth terminal;

a first transistor being of a first conductivity type, having a base electrode connected to said first terminal, having an emitter electrode connected to said third terminal, and having a collector electrode connected to said fourth terminal;

a first controlled current source responsive to said control signal to supply a first controlled current to said second terminal;

diode means connected between said second and said third terminal and poled to conduct said first controlled current, said diode means responding to said first controlled current to develop a substantially direct offset potential thereacross, which offset potential is continually applied without substantial attenuation as quiescent base-emitter potential to said first transistor to control the flow of collector current of said first transistor; and a second controlled current source responsive to said control signal for supplying a second controlled current applied to said fourth terminal to counteract changes in the quiescent component of said first transistor collector current as supplied to said load.

2. An amplifier as set forth in claim 1 having:

a fifth terminal for application of an operating potential;

first and second resistive means, said first resistive means being connected between said fifth and said second terminals, said second resistive means being connected between said fifth and said fourth terminals; and second and third transistors being of said first conductivity type, having their base electrodes each connected to at least a portion of said control signal, having their emitter electrodes connected to said third terminal, and having their respective collector electrodes respectively connected to said second and said fourth terminals, said first resistive means and said second transistor being included in said first controlled current source and said third transistor being included in said second controlled current source.

3. An amplifier as set forth in claim 2 having:

means connecting each of said second and said third transistors in a current mirror amplifier configuration for better defining the relationships of their collector currents to said control signal.

4. An amplifier as set forth in claim 1 having:

a fifth terminal for application of an operating potential; and second and third transistors being of a second conductivity type complementary to said first conductivity type, having their base electrodes each connected to receive at least a portion of said control signal, having their emitter electrodes connected to said fifth terminal, having their responsive collector electrodes respectively connected to said second and said fourth terminals, and being included respectively in said first controlled current source and in said second controlled current source.

5. An amplifier as set forth in claim 3 having:

means connecting each of said second and said third transistors in a current mirror amplifier configuration for better defining the relationships of their collector currents to said control signals.

6. An amplifier as set forth in claim 1 having:

a fifth terminal for application of an operating potential;

a second transistor being of said first conductivity type, having a base electrode connected to said second terminal, having an emitter electrode connected to said third terminal, and having a collector electrode; and current mirror amplifier means having an input terminal to which the collector electrode of said second transistor is connected, having a common terminal connected to said fifth terminal and having an output terminal connected to said fourth terminal.

7. An amplifier as set forth in claim 1 having:

a fifth terminal for application of an operating potential, a current mirror amplifier having an input terminal between which and said second terminal said first control current source is connected, having a common terminal connected to said fifth terminal and having an output terminal connected to said fourth terminal.

8. An amplifier as set forth in claim 1 where said diode means is provided by:

a further transistor having an emitter electrode connected to said third terminal, having a collector electrode connected to said first controlled current source, having a base electrode connected to said second terminal and being self-biased by direct coupling of its collector electrode to its base electrode.

* * * * *